March 17, 1953 J. ONIA 2,632,064

PULSE AMPLIFIER

Filed Sept. 20, 1950

INVENTOR.
JOHN ONIA
BY
Ellsworth R. Roston
ATTORNEY

Patented Mar. 17, 1953 2,632,064

UNITED STATES PATENT OFFICE 2,632,064

PULSE AMPLIFIER

John Onia, Berkley, Mich., assignor to Bendix Aviation Corporation, Detroit, Mich., a corporation of Delaware Application September 20, 1950, Serial No. 185,896

6 Claims. (Cl. 179—171)

This invention relates to amplifiers and more particularly to amplifiers providing a large gain in signal strength in one stage.

In many electronic applications, where space is an important factor, such as in military equipment, it is often necessary for a relatively weak input signal to be amplified considerably with a minimum number of vacuum tubes and a minimum amount of power consumption. Various attempts have been made to provide a circuit meeting these requirements, but with indifferent success.

This invention provides an amplifier which in effect produces in one stage a signal amplification equal to that produced by two normal amplifier stages. In addition to occupying a minimum amount of space, the amplifier consumes a minimum amount of power and operates in a positive and reliable manner to achieve the desired result.

An object of this invention is to provide an amplifier producing a maximum amount of amplification in one stage.

Another object of the invention is to provide an amplifier of the above character capable of operating on input signals of relatively weak intensity to produce a strong output signal.

A further object is to provide an amplifier of the above character operative in a positive manner to give a considerable amplification in a minimum amount of space and with a minimum number of parts.

Still another object is to provide an amplifier of the above character requiring a minimum amount of power to produce a considerable amplification.

A still further object is to provide an amplifier of the above character which is simple, efficient and reliable.

Other objects and advantages will be apparent from a detailed description of the invention and from the appended drawings and claims.

Figure 1:
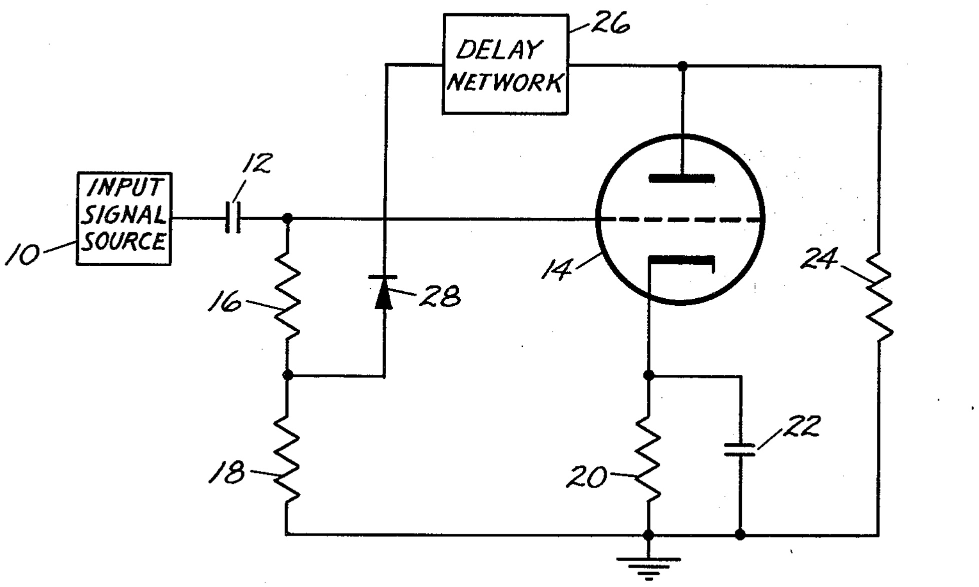
Figure 1 is a circuit diagram of one embodiment of the invention.

In the embodiment of the invention shown in Figure 1, a signal source 10 is connected through a coupling capacitance 12 to the grid of a vacuum tube 14. The grid is grounded through a pair of resistances 16 and 18 in series, the resistance 16 having a considerably higher value than the resistance 18 to provide a high input impedance to the tube 14.

Figure 2:
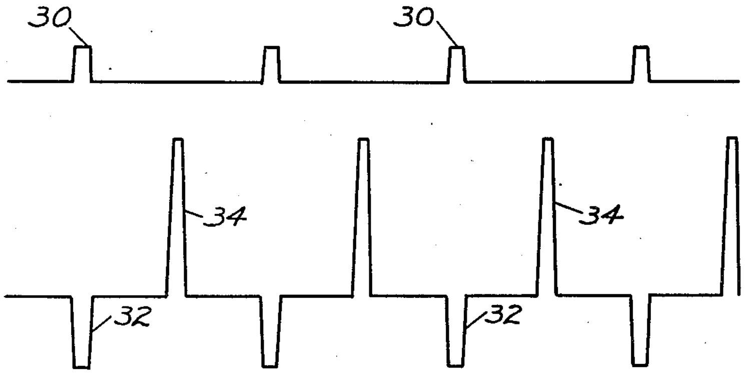
Figure 2 illustrates wave forms of voltages at strategic points in the circuit shown in Figure 1.

The cathode of the tube is grounded through a relatively low bias resistance 20 in parallel with a by-pass capacitance 22. The plate of the tube 14 is connected to a grounded resistance 24 having substantially the same value as the resistance 18 and to a delay network 26 having an impedance equal to substantially half the value of the resistances 18 and 24. The delay network 26 is in turn connected to the negative electrode of a rectifier 28, such as a crystal diode, the positive electrode of which is connected to the common terminal between the resistances 16 and 18. When a positive pulse, illustrated at 30 in Figure 2, is introduced from the source 10 to the grid of the tube 14, the current through the tube increases and causes the voltage on the plate of the tube to drop. The negative pulse 32 on the plate is delayed by the network 26 before being fed through the rectifier 28 and resistance 16 back to the grid of the tube. When the source 10 provides pulses at a substantially constant rate, as illustrated in Figure 2, the delay of the network 26 is chosen such that each negative pulse 32 is fed back to the grid of the tube 14 before the introduction of the next input pulse 30.

Because of the amplification provided by the tube 14, the negative pulse 32 has a greater amplitude than the positive pulse 30 originally introduced to the grid of the tube. This negative pulse in turn causes the current through the tube to decrease considerably and a positive pulse 34 of very large amplitude to be produced on the tube plate. The positive pulse 34 can not be fed through the delay network 26 to the grid of the tube 14 because of the polarity of the rectifier 28.

Since the negative pulse 32 is fed back to the grid of the tube 14 to produce the amplified positive pulse 34, the total amplification through the tube is equivalent to that normally produced in two stages. Thus, if the pulse 30 from the source 10 has an amplitude E and if the amplifier has a voltage gain of G, the output pulse produced across the resistance 24 will have an amplitude of substantially $E(G)^2$.

The amplifier disclosed above provides an increased gain per stage because of the double amplification produced by the tube 14. Thus, the amplifier is capable of raising the amplitude of relatively weak input signals to a reasonable value in one stage. The amplifier operates in a positive manner and with a minimum power consumption to produce an output signal having the same polarity as the input signal. Because of the effective consolidation of two amplifier stages in one stage, the amplifier occupies a minimum amount of space and utilizes a minimum number of parts.

Although the amplifier has been disclosed as operating with input pulses of positive polarity, input pulses of negative polarity may be introduced to the grid of the tube 14 to produce a double amplification similar to that disclosed above if the positive and negative terminals of the rectifier 28 are inverted.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

What is claimed is:

1. An amplifier, including, a tube having a cathode, grid and plate, a delay network, means for introducing to the grid of the tube pulses having a greater separation in time than the time delay provided by the network, means for passing pulses having only a predetermined polarity, the delay network and the polarizing means being connected in series between the plate and grid of the tube to introduce to the grid for regeneration only pulses of the predetermined polarity.

2. An amplifier, including, a tube having a cathode, grid and plate, a delay network, means for introducing to the grid of the tube signals having a greater separation in time than the time delay provided by the network, means for passing signals having only a predetermined polarity, the delay network and the polarizing means being connected in series between the plate and grid of the tube to introduce to the grid for regeneration only signals of the predetermined polarity, and means connected between the plate and cathode of the tube to provide an impedance having a predetermined relationship to that of the delay network.

3. An amplifier, including, a tube having a cathode, grid and plate, means for introducing to the grid of the tube input pulses spaced at predetermined intervals, a delay network having a shorter delay than the time interval between successive pulses to provide a time lag for the pulses passing through the tube, a rectifier connected in series with the delay network between the plate and grid of the tube to feed into the grid pulses having only a predetermined polarity, and means connected between the plate and cathode of the tube to provide an impedance approximately twice as great as the impedance presented by the delay network.

4. An amplifier, including, a tube having a cathode, grid and plate, means for introducing to the grid of the tube input pulses spaced at predetermined intervals, a delay network having a shorter delay than the time interval between successive pulses to provide a time lag for the pulses passing through the tube, polarizing means connected in series with the delay network between the plate and grid of the tube to feed into the grid pulses having only a predetermined polarity, means connected between the polarizing means and the cathode of the tube to provide an impedance approximately twice as great as the impedance provided by the delay network, and means connected between the plate and cathode of the tube to provide an impedance approximately twice as great as the impedance provided by the delay network.

5. An amplifier, including, a tube having a cathode, grid and plate, a delay network connected to the plate of the tube, a signal source for introducing to the grid of the tube pulses having a greater separation in time than the time delay provided by the network, a rectifier connected in series with the delay network to pass pulses having only a predetermined polarity, a resistance connected between the delay network and the cathode of the tube and having a value substantially twice as great as the impedance provided by the network, and a resistance connected between the plate and cathode of the tube and having a value substantially twice as great as the impedance provided by the delay network.

6. An amplifier, including, a tube having a cathode, grid and plate, a signal source for introducing to the grid of the tube input pulses spaced at predetermined intervals, a delay network connected to the plate of the tube and producing a shorter delay than the time interval between successive pulses to provide a time lag for the pulses passing through the tube, a rectifier connected in series with the delay network between the plate and grid of the tube to introduce to the grid pulses having only a predetermined polarity, a first resistance connected between the delay network and the cathode of the tube and having a value substantially twice as great as the impedance provided by the network, a second resistance connected between the delay network and the grid of the tube and having a value considerably higher than that of the first resistance, and a third resistance connected between the plate and the cathode of the tube and having a value substantially twice as great as the impedance provided by the network.

JOHN ONIA.

REFERENCES CITED

The following references are of record in the file of this patent:

UNITED STATES PATENTS

| Number | Name | Date |
|---|---|---|
| 2,215,777 | Benz | Sept. 24, 1940 |
| 2,412,995 | Levy | Dec. 24, 1946 |
| 2,419,340 | Easton | Apr. 22, 1947 |
| 2,471,252 | Toulon | May 24, 1949 |
| 2,597,029 | Phinney et al. | May 20, 1952 |

FOREIGN PATENTS

| Number | Country | Date |
|---|---|---|
| 270,871 | Great Britain | May 19, 1927 |
| 693,570 | France | Sept. 1, 1930 |